United States Patent
Koshimizu et al.

(10) Patent No.: US 9,136,097 B2
(45) Date of Patent: Sep. 15, 2015

(54) SHOWER PLATE AND SUBSTRATE PROCESSING APPARATUS

(75) Inventors: Chishio Koshimizu, Nirasaki (JP);
Kazuki Denpoh, Nirasaki (JP);
Hiromasa Mochiki, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 1069 days.

(21) Appl. No.: 12/266,800

(22) Filed: Nov. 7, 2008

(65) Prior Publication Data

US 2009/0120582 A1    May 14, 2009

Related U.S. Application Data

(60) Provisional application No. 61/050,664, filed on May 6, 2008.

(30) Foreign Application Priority Data

Nov. 8, 2007    (JP) .................................. 2007-291064

(51) Int. Cl.
*C23C 16/00* (2006.01)
*C23F 1/00* (2006.01)
*H01L 21/306* (2006.01)
*H01J 37/32* (2006.01)

(52) U.S. Cl.
CPC ....... *H01J 37/3244* (2013.01); *H01J 37/32449* (2013.01)

(58) Field of Classification Search
CPC . H01J 37/3244; H01J 37/321; H01J 37/3211; H01J 37/32449; H01J 37/32724; H01J 37/32541; C23C 16/45565; C23C 16/455; C23C 16/45502; C23C 16/45504; H01L 21/67069

USPC .......................... 118/715; 156/345.33, 345.34
See application file for complete search history.

(56) References Cited

U.S. PATENT DOCUMENTS

| | | | | |
|---|---|---|---|---|
| 4,590,042 | A * | 5/1986 | Drage ...................... | 422/186.06 |
| 5,589,002 | A * | 12/1996 | Su .............................. | 118/723 E |
| 6,793,733 | B2 * | 9/2004 | Janakiraman et al. ........ | 118/715 |
| 6,942,753 | B2 * | 9/2005 | Choi et al. ................ | 156/345.34 |
| 2003/0140851 | A1 | 7/2003 | Janakiraman et al. | |
| 2006/0196604 | A1 | 9/2006 | Moriya et al. | |

(Continued)

FOREIGN PATENT DOCUMENTS

| | | |
|---|---|---|
| CN | 1659308 A | 8/2005 |
| JP | 2002-25984 A | 1/2002 |

(Continued)

*Primary Examiner* — Rakesh Dhingra
(74) *Attorney, Agent, or Firm* — Rothwell, Figg, Ernst & Manbeck, P.C.

(57) ABSTRACT

A shower plate of a processing gas supply unit disposed in a processing chamber of a substrate processing apparatus to supply a processing gas into a processing space in the processing chamber. The shower plate is interposed between a processing gas introduction space formed in the processing gas supply unit for introduction of the processing gas and the processing space. The shower plate includes processing gas supply passageways which allow the processing gas introduction space to communicate with the processing space. The processing gas supply passageways include gas holes formed toward the processing gas introduction space and gas grooves formed toward the processing space, the gas holes and gas grooves communicating with each other. A total flow path cross sectional area of all the gas grooves is larger than a total flow path cross sectional area of all the gas holes.

14 Claims, 10 Drawing Sheets

(56) References Cited

U.S. PATENT DOCUMENTS

2006/0288934 A1  12/2006  Takahashi et al.
2007/0095284 A1*  5/2007  Iizuka et al. ................... 118/715
2007/0144671 A1*  6/2007  Ohmi et al. ............... 156/345.34

FOREIGN PATENT DOCUMENTS

| JP | 2005-033167 | * | 2/2005 | ............ H01L 21/306 |
| JP | 2005-347624 | * | 12/2005 | ............. H01L 21/31 |
| JP | 2006-245214 | | 9/2006 | |

* cited by examiner

SHOWER PLATE AND SUBSTRATE PROCESSING APPARATUS

FIELD OF THE INVENTION

The present invention relates to a shower plate and a substrate processing apparatus; and more particularly, to a shower plate of a shower head for supplying a processing gas to a processing space in a chamber of a substrate processing apparatus.

BACKGROUND OF THE INVENTION

Generally, a substrate processing apparatus includes a chamber for accommodating a wafer serving as a substrate. The substrate processing apparatus performs a plasma process on the wafer by using plasma generated from a processing gas in a processing space in the chamber. The processing gas is supplied into the processing space in the chamber through a shower head disposed at an upper portion of the chamber.

FIGS. 10A and 10B schematically show a configuration of a shower head in a conventional substrate processing apparatus. FIG. 10A illustrates a cross sectional view of a conventional shower head. FIG. 10B illustrates a bottom view of the conventional shower head. Further, FIG. 10A illustrates a cross sectional view taken along a line 10A-10A of FIG. 10B.

As shown in FIGS. 10A and 10B, a shower head 90 includes a circular plate-shaped shower plate 91, a circular plate-shaped cooling plate 92 disposed on the shower plate 91 and a plate supporting body 93 for supporting the shower plate 91. The plate supporting body 93 is formed of a cylindrical member having a portion bored from the bottom. The shower plate 91 and the cooling plate 92 are received in the bored portion. The cooling plate 92 and the plate supporting body 93 form a space 94 between the cooling plate 92 and the plate supporting body 93. A processing gas is introduced into the space 94 from a processing gas inlet pipe 95. Further, the shower plate 91 faces a processing space (not shown) in the chamber.

The shower plate 91 and the cooling plate 92 have a plurality of gas holes 96 and 97 formed therethrough in their thickness directions, respectively. The space 94 communicates with the processing space via the gas holes 96 and 97. The processing gas introduced into the space 94 is supplied into the processing space through the gas holes 96 and 97. Further, since the gas holes 96 are arranged dispersedly as shown in FIG. 10B, the processing gas is also supplied dispersedly.

However, as known conventionally, plasma in the processing space flows into the gas holes 96 and 97 to cause abnormal discharge in the gas holes 96 and 97. When abnormal discharge occurs, alumite is peeled off from the cooling plate 92 to generate particles.

Accordingly, the gas holes of the shower plate or the cooling plate are formed in a labyrinthine shape to prevent plasma from flowing into the gas holes, thereby preventing abnormal discharge in the gas holes (see, for example, Japanese Laid-open Publication No. 2007-5491 and U.S. Patent Application Publication No. 2006/0288934 A1).

However, even though the gas holes are formed in a labyrinthine shape, when the shower plate is used for a while, abnormal discharge occurs in the gas holes.

In the shower plate 91 having the gas holes 96 in which abnormal discharge occurs, part of the gas holes 96 near to the processing space are expanded in a balloon shape as shown in FIG. 11. Accordingly, local discharge is generated in the gas holes 96, and the gas holes 96 are gradually eroded by the local discharge. If an expanded level of the gas holes 96 exceeds a certain value, it is assumed that abnormal discharge can occur therein.

SUMMARY OF THE INVENTION

In view of the above, the present invention provides a shower plate and a substrate processing apparatus capable of preventing abnormal discharge in order to prolong a lifetime of the shower plate.

In accordance with a first aspect of the present invention, there is provided a shower plate of a processing gas supply unit disposed in a processing chamber of a substrate processing apparatus to supply a processing gas into a processing space in the processing chamber, which is interposed between a processing gas introduction space formed in the processing gas supply unit for introduction of the processing gas and the processing space, the shower plate comprising: processing gas supply passageways which allow the processing gas introduction space to communicate with the processing space, wherein the processing gas supply passageways include gas holes formed toward the processing gas introduction space and gas grooves formed toward the processing space, the gas holes and the gas grooves communicating with each other, and a total flow path cross sectional area of all the gas grooves is larger than a total flow path cross sectional area of all the gas holes.

In accordance with a second aspect of the present invention, there is provided a substrate processing apparatus comprising a processing chamber for accommodating a substrate and performing a process on the substrate, and a processing gas supply unit disposed in the processing chamber to supply a processing gas into a processing space in the processing chamber, wherein the processing gas supply unit includes a shower plate interposed between a processing gas introduction space formed in the processing gas supply unit for introduction of the processing gas and the processing space, the shower plate having processing gas supply passageways which allow the processing gas introduction space to communicate with the processing space, the processing gas supply passageways include gas holes formed toward the processing gas introduction space and gas grooves formed toward the processing space, the gas holes and the gas grooves communicating with each other, and a total flow path cross sectional area of all the gas grooves is larger than a total flow path cross sectional area of all the gas holes.

According to the shower plate and the substrate processing apparatus of the first and second aspects, in the processing gas supply passageways which allow the processing gas introduction space to communicate with the processing space and include gas holes formed toward the processing gas introduction space and gas grooves formed toward the processing space, the total flow path cross sectional area of all the gas grooves is larger than the total flow path cross sectional area of all the gas holes. When the processing gas is supplied to the processing space through the processing gas introduction space, the pressure of the processing gas in the processing gas supply passageways increases along with the supply, and local discharge may occur from the processing gas in the processing gas supply passageways. However, since the total flow path cross sectional area of all the gas grooves is larger than the total flow path cross sectional area of all the gas holes, the pressure of the processing gas in the gas grooves does not increase in the supply of the processing gas. Accordingly, local discharge in the gas grooves does not occur. As a result, it is possible to prevent the gas grooves from being gradually eroded. Further, it is possible to surely prevent generation of abnormal discharge, thereby prolonging a lifetime of the shower plate.

In the shower plate, preferably, the total flow path cross sectional area of all the gas grooves is 1.75 or more times as large as the total flow path cross sectional area of all the gas holes. Accordingly, it is possible to surely prevent an increase in the pressure of the processing gas in the gas grooves in the supply of the processing gas. Thus, it is possible to surely prevent generation of abnormal discharge.

In the shower plate, preferably, each depth of the gas grooves is larger than 5 mm. When ions enter into the processing gas supply passageways from the processing space and the ions reach a surface facing the processing gas introduction space, abnormal discharge may occur in the vicinity of the surface. However, since the ions enter to a depth of at most 5 mm, when each depth of the gas grooves is set to be larger than 5 mm, the ions are prevented from reaching the surface facing the processing gas introduction space, and it is possible to prevent abnormal discharge due to the ions.

In the shower plate, preferably, the gas grooves are linearly formed parallel to each other on a surface facing the processing space. Accordingly, the gas grooves can be easily formed, thereby preventing abnormal discharge while reducing the cost of the shower plate.

In the shower plate, preferably, the gas holes are uniformly arranged in a longitudinal direction of the corresponding gas grooves to have openings at bottom portions of the gas grooves. Accordingly, the processing gas in the gas grooves can be substantially uniformly dispersed. Thus, it is possible to uniformly supply the processing gas into the processing space from the shower plate.

In the shower plate, preferably, the shower plate further includes a first member and a second member formed by dividing the shower plate into two sections in a vertical direction, wherein the first member is disposed toward the processing gas introduction space and the second member is disposed toward the processing space, and the gas holes are formed in the first member and the gas grooves are formed in the second member. Accordingly, the gas holes and the gas grooves can be more easily formed.

In the substrate processing apparatus, preferably, the processing gas supply unit further includes a cooling plate interposed between the processing gas introduction space and the shower plate to cool the shower plate, and the cooling plate has through holes for allowing the processing gas introduction space to communicate with the processing gas supply passageways. Accordingly, the cooling plate can cool the shower plate without interfering with the supply of the processing gas.

In accordance with a third aspect of the present invention, there is provided a substrate processing apparatus comprising a processing chamber for accommodating a substrate and performing a process on the substrate, and a processing gas supply unit disposed in the processing chamber to supply a processing gas into a processing space in the processing chamber, wherein the processing gas supply unit includes a shower plate interposed between a processing gas introduction space formed in the processing gas supply unit for introduction of the processing gas and the processing space, and a cooling plate interposed between the processing gas introduction space and the shower plate to cool the shower plate, the shower plate has gas grooves formed therethrough in a vertical direction to communicate with the processing space, the cooling plate has gas holes for allowing the processing gas introduction space to communicate with the gas grooves, and a total flow path cross sectional area of all the gas grooves is larger than a total flow path cross sectional area of all the gas holes.

In the substrate processing apparatus of the third aspect, the total flow path cross sectional area of all the gas grooves formed through the shower plate in a vertical direction is larger than the total flow path cross sectional area of all the gas holes formed in the cooling plate to allow the processing gas introduction space to communicate with the gas grooves. When the processing gas is supplied to the processing space through the processing gas introduction space, the pressure of the processing gas in the gas grooves communicating with the processing space increases along with the supply, and local discharge may occur from the processing gas in the gas grooves. However, since the total flow path cross sectional area of all the gas grooves is larger than the total flow path cross sectional area of all the gas holes, the pressure of the processing gas in the gas grooves does not increase in the supply of the processing gas. Accordingly, local discharge in the gas grooves does not occur. As a result, it is possible to prevent the gas grooves from being gradually eroded. Further, it is possible to surely prevent generation of abnormal discharge, thereby prolonging a lifetime of the shower plate.

BRIEF DESCRIPTION OF THE DRAWINGS

The above features of the present invention will become apparent from the following description of embodiments given in conjunction with the accompanying drawings, in which:

FIGS. 5A and 5B schematically show a configuration of the shower plate in accordance with the embodiment of the present invention, wherein FIG. 5A illustrates an enlarged cross sectional view of a shower head having the shower plate and FIG. 5B illustrates a bottom view of the shower plate;

FIGS. 7A and 7B schematically show a configuration of a modified example of the shower plate in accordance with the embodiment of the present invention, wherein FIG. 7A illustrates a bottom view of a first modified example and FIG. 7B illustrates a bottom view of a second modified example;

FIGS. 8A and 8B schematically show a configuration of a third modified example of the shower plate in accordance with the embodiment of the present invention, wherein FIG. 8A illustrates an enlarged cross sectional view of a shower head having the shower plate and FIG. 8B illustrates a bottom view of the shower plate;

FIGS. 9A and 9B schematically show a configuration of a fourth modified example of the shower plate in accordance with the embodiment of the present invention, wherein FIG. 9A illustrates an enlarged cross sectional view of a shower head having the shower plate and FIG. 9B illustrates a bottom view of the shower plate;

FIGS. 10A and 10B schematically show a configuration of a shower head of a conventional substrate processing apparatus, wherein FIG. 10A illustrates a cross sectional view of a conventional shower head and FIG. 10B illustrates a bottom view of the conventional shower head.

DETAILED DESCRIPTION OF THE EMBODIMENTS

Hereinafter, embodiments of the present invention will be described in detail with reference to the accompanying drawings which form a part hereof.

Figure 1:
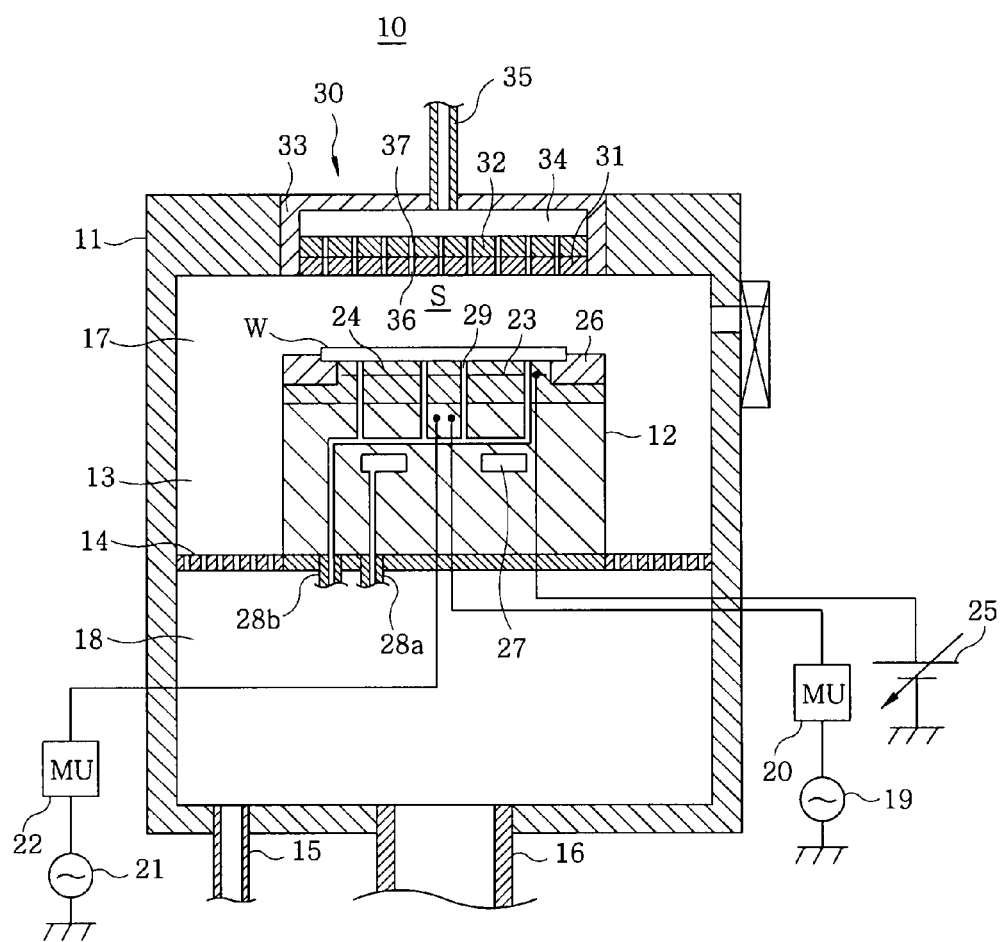
FIG. 1 is a cross sectional view showing a schematic configuration of a substrate processing apparatus including a shower plate in accordance with an embodiment of the present invention.

FIG. 1 schematically shows a cross sectional view of a substrate processing apparatus including a shower plate in accordance with an embodiment of the present invention. The substrate processing apparatus is configured to perform a plasma process, e.g., an etching process, on a semiconductor wafer serving as a substrate.

Referring to FIG. 1, a substrate processing apparatus 10 includes a chamber (processing chamber) 11 which accommodates a semiconductor wafer (hereinafter, simply referred to as a "wafer") W having a diameter of, for example, 300 mm. A cylindrical susceptor 12 for mounting the wafer W thereon is disposed in the chamber 11. In the substrate processing apparatus 10, a side exhaust path 13 is formed by an inner sidewall of the chamber 11 and the side surface of the susceptor 12. The side exhaust path 13 functions as a flow path for discharging a gas above the susceptor 12 out of the chamber 11. An exhaust plate 14 is disposed in the middle of the side exhaust path 13.

The exhaust plate 14 is a plate-shaped member having a number of holes. The exhaust plate 14 functions as a partition plate which divides the chamber 11 into an upper portion and a lower portion. In the upper portion (hereinafter, referred to as a "reaction chamber") 17 of the chamber 11 defined by the exhaust plate 14, plasma is generated as will be described later. The lower portion (hereinafter, referred to as an "exhaust chamber (manifold)") 18 of the chamber 11 is connected to a rough exhaust pipe 15 and a main exhaust pipe 16 which discharge gas out of the chamber 11. The rough exhaust pipe 15 is connected to a dry pump DP (not shown), and the main exhaust pipe 16 is connected to a turbo molecular pump TMP (not shown). Further, the exhaust plate 14 captures or reflects ions and radicals produced in a processing space S between the susceptor 12 and a shower head 30 to be described later in the reaction chamber 17 to prevent the ions and radicals from leaking into the manifold 18.

The rough exhaust pipe 15 and the main exhaust pipe 16 discharge gas in the reaction chamber 17 out of the chamber 11 via the manifold 18. Specifically, the rough exhaust pipe 15 reduces the pressure in the chamber 11 from an atmospheric pressure to create a low vacuum state, and the main exhaust pipe 16 is operated together with the rough exhaust pipe 15 and reduces the pressure in the chamber 11 to create a high vacuum state (e.g., 133 Pa (1 Torr) or less) at which the pressure is lower than that of the low vacuum state.

The susceptor 12 is connected to a first high frequency power supply 19 via a first matching unit 20. The first high frequency power supply 19 supplies high frequency power having a relatively high frequency, e.g., 40 MHz, to the susceptor 12. Accordingly, the susceptor 12 serves as a high frequency electrode to apply a high frequency voltage of 40 MHz to the processing space S. Further, the first matching unit 20 reduces reflection of high frequency power from the susceptor 12 to maximize efficiency in supplying high frequency power to the susceptor 12.

Further, the susceptor 12 is also connected to a second high frequency power supply 21 via a second matching unit 22. The second high frequency power supply 21 supplies high frequency power having a frequency, e.g., 2 MHz, which is lower than that of the high frequency power supplied from the first high frequency power supply 19, to the susceptor 12.

An electrostatic chuck 24 having an electrostatic electrode plate 23 therein is disposed on the susceptor 12. The electrostatic chuck 24 includes a lower circular plate-shaped member having a certain diameter and an upper circular plate-shaped member stacked on the lower circular plate-shaped member and having a diameter smaller than that of the lower circular plate-shaped member. Further, the electrostatic chuck 24 is formed of ceramic. When the wafer W is mounted on the susceptor 12, the wafer W is disposed on the upper circular plate-shaped member of the electrostatic chuck 24.

Further, the electrostatic electrode plate 23 of the electrostatic chuck 24 is electrically connected to a DC power supply 25. When a positive DC high voltage is applied to the electrostatic electrode plate 23, a negative potential is generated on the surface (hereinafter, referred to as a "rear surface") of the wafer W facing the electrostatic chuck 24 to cause a potential difference between the electrostatic electrode plate 23 and the rear surface of the wafer W. Accordingly, the wafer W is adsorptively held on the upper circular plate-shaped member of the electrostatic chuck 24 by a Coulomb force or a Johnson-Rahbeck force due to the potential difference.

An annular focus ring 26 is mounted on the electrostatic chuck 24. The focus ring 26 is formed of a conductive material, for example, silicon, to surround the wafer W adsorptively held on the upper circular plate-shaped member of the electrostatic chuck 24. Further, the focus ring 26 concentrates plasma of the processing space S on the surface of the wafer W to improve etching efficiency.

Further, an annular coolant chamber 27 extending, for example, in a circumferential direction of the susceptor 12 is provided inside the susceptor 12. The coolant chamber 27 is supplied with a low-temperature coolant, for example, cooling water or Galden (registered trademark) from a chiller unit (not shown) via a coolant line 28a by circulation. The susceptor 12, cooled by the low-temperature coolant, cools the wafer W and the focus ring 26 through the electrostatic chuck 24.

A plurality of heat transfer gas supply holes 29 are formed to have openings at a portion (hereinafter, referred to as an "adsorption surface") of the upper circular plate-shaped member of the electrostatic chuck 24 on which the wafer W is adsorptively held. The heat transfer gas supply holes 29 are connected to a heat transfer gas supply unit (not shown) via a heat transfer gas supply line 28b. The heat transfer gas supply unit supplies, for example, a helium (He) gas serving as a heat transfer gas into a gap between the adsorption surface and the rear surface of the wafer W through the heat transfer gas supply holes 29. The helium gas supplied into the gap between the adsorption surface and the rear surface of the wafer W efficiently transfers heat of the wafer W to the electrostatic chuck 24.

The shower head (processing gas supply unit) 30 is provided at a ceiling portion of the chamber 11 to face the susceptor 12. The shower head 30 includes a circular plate-shaped shower plate 31, a circular plate-shaped cooling plate 32 disposed on the shower plate 31 and a plate supporting body 33 for supporting the shower plate 31.

The plate supporting body 33 is formed of a cylindrical member having a central portion bored from the bottom. The shower plate 31 and the cooling plate 32 are received in the bored portion. The cooling plate 32 and the plate supporting body 33 form a space (processing gas introduction space) 34 between the cooling plate 32 and the plate supporting body 33. A processing gas is introduced into the space 34 from a processing gas inlet pipe 35. Further, since the shower plate 31 faces the processing space S, the temperature of the shower plate 31 increases due to heat transferred from the plasma of the processing space S, but the cooling plate 32 cools the shower plate 31 to stabilize an etching process.

The shower plate 31 has processing gas supply passageways 36 formed therethrough in a thickness direction (vertical direction). The cooling plate 32 has a plurality of gas holes (through holes) 37 formed therethrough in a thickness direction. The space 34 and the processing space S communicate with each other through the processing gas supply passageways 36 and the gas holes 37. The processing gas introduced into the space 34 is supplied into the processing space S through the processing gas supply passageways 36 and the gas holes 37.

Further, the shower plate 31 of the shower head 30 is formed of silicon, and the cooling plate 32 is formed of alumite-treated aluminum. The configuration of the shower plate 31 will be described later.

In the substrate processing apparatus 10, high frequency power is supplied to the susceptor 12 to apply a high frequency voltage to the processing space S. Accordingly, in the processing space S, the processing gas supplied through the shower head 30 is converted to a high-density plasma to produce ions or radicals. Thus, an etching process is performed on the wafer W by the ions or the like.

Further, operations of respective components of the substrate processing apparatus 10 are controlled based on a program corresponding to an etching process by a CPU of a controller (not shown) provided in the substrate processing apparatus 10.

Figure 11:
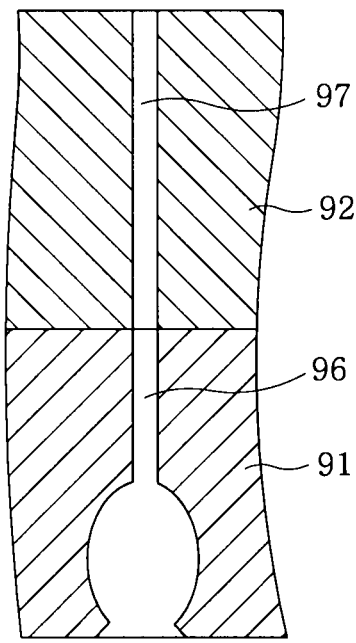
FIG. 11 is an enlarged cross sectional view showing gas holes in which abnormal discharge occurs in the shower plate.

Meanwhile, it is difficult to clearly explain a generation mechanism of local discharge in the gas holes of the above-mentioned conventional shower plate. However, the present inventors deduce the following hypotheses by taking consideration of expanded positions of the gas holes 96 or an environment around and inside the gas holes 96 in the etching process (see FIG. 11).

[1] Since the pressure of the space 94 is 10 Torr ($1.3 \times 10^3$ Pa) and the pressure of the processing space is about 30 mTorr (4.0 Pa) in the etching process, the pressure of the processing gas in the gas holes 96 toward the processing space is about 1 Torr when the processing gas is supplied from the space 94 to the processing space. The pressure of 1 Torr is a relatively high pressure, and it means that there are a number of molecules of the processing gas in the gas holes 96 toward the processing space.

[2] In the etching process, electrons entering into the gas holes 96 collide with the molecules of the processing gas. Accordingly, an ionization reaction occurs to cause local discharge. In this case, an ionization level (ionization rate) is represented by the following equation.

Ionization rate=Ionization rate coefficient×Electron density×Processing gas density According to the above hypotheses, when the pressure of the processing gas in the gas holes 96 decreases, the number of molecules of the processing gas decreases (molecule density decreases). Accordingly, since a collision probability of the molecules of the processing gas and the electrons is reduced, local discharge hardly occurs.

Thus, in order to verify the above hypotheses, the present inventors perform a following simulation by using a computer to check whether the electrons enter into the gas holes 96 or not.

Figure 3:
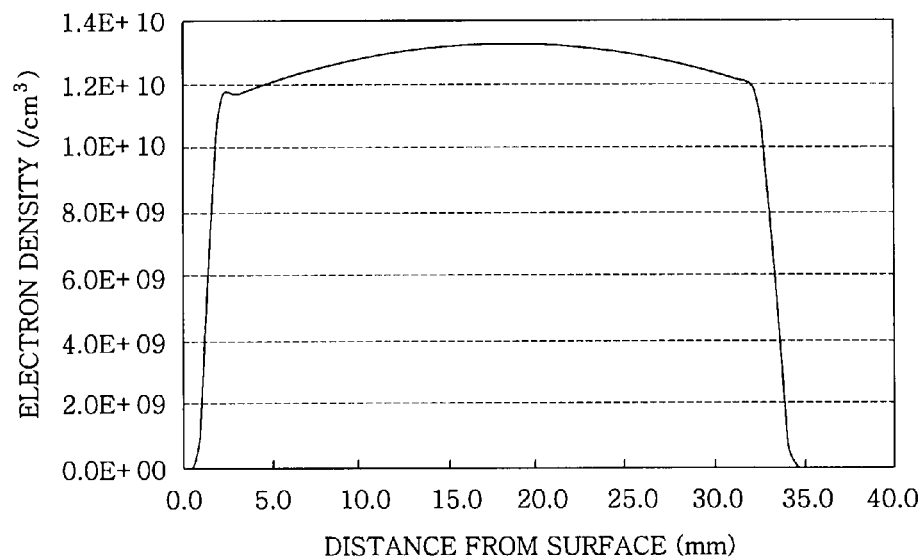
FIG. 3 is a graph showing results of simulations of electrons which may enter into the gas holes of the shower plate during the etching process.

FIG. 3 is a graph showing simulation results of electrons which may enter into the gas holes of the shower plate in the etching process. In the graph, the vertical axis represents electron density and the horizontal axis represents a distance from the surface (hereinafter, referred to as a "bottom surface") of the shower plate facing the processing space. In the horizontal axis, each depth of the gas holes has a negative value.

In the graph of FIG. 3, when the distance from the bottom surface is 0 mm or less, that is, in the gas holes, the electron density is zero. However, the simulation results of FIG. 3 are obtained at a certain phase of the high frequency voltage. On the other hand, in the simulation results of other phases, the electron density was zero or more even when the distance from the bottom surface was 0 mm or less. Accordingly, it was checked that electrons enter into the gas holes and the electrons collide with the molecules of the processing gas.

Figure 2:
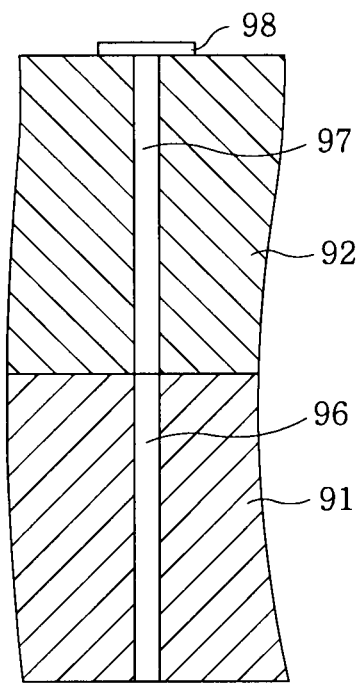
FIG. 2 is an enlarged cross sectional view showing gas holes of the shower plate in which abnormal discharge has never occurred.

Further, the inventers conducted an etching process while the pressure of the processing gas was reduced in some of the gas holes 96 in order to investigate relation between the pressure of the processing gas (density of the processing gas) and the generation of local discharge. Specifically, as shown in FIG. 2, openings of the gas holes 97 toward the space 94 were closed by covers 98 to prevent the processing gas from flowing into the gas holes 96 and 97. Accordingly, while the pressure of the gas holes 96 and 97 was set at 30 mTorr, which was the same as the pressure of the processing space, the etching process was conducted.

During the etching process, the generation of local discharge in the gas holes 96 was not observed. As a result of investigation on the shape of the gas holes 96 after the etching process, it was checked that balloon-shaped expansion was not generated. That is, it could be seen that local discharge was not generated when the pressure of the processing gas (density of the processing gas) was reduced.

From the above fact, the present inventors verified the hypotheses on the generation mechanism of local discharge in the gas holes of the shower plate.

Further, the present inventors conducted a following experiment to determine a detailed shape of the processing gas supply passageways 36 in the shower plate 31.

In order to reduce the pressure of the processing gas in the processing gas supply passageways 36, it is convenient to increase a flow path cross sectional area (cross sectional area perpendicular to a flow path of the processing gas) of the processing gas supply passageways 36. Thus, the present inventors conducted an etching process in a substrate processing apparatus including a shower plate having enlarged gas holes, wherein a total flow path cross sectional area of all the enlarged gas holes was 1.75 times as large as a total flow path cross sectional area of all gas holes (gas holes 96) of a conventional shower plate (shower plate 91). As a result, it was checked that abnormal discharge did not occur. Consequently, it could be seen that local discharge was prevented by making the total flow path cross sectional area of all gas holes of the shower plate to be 1.75 or more times as large as that of the conventional shower plate.

Further, when positive ions enter into the gas holes of the processing gas supply passageways 36 from the processing space S and the positive ions reach the surface (hereinafter, referred to as a "top surface") (specifically, a boundary between the shower plate 31 and the cooling plate 32) of the shower plate 31 facing the space 34, abnormal discharge may occur in the vicinity of the top surface. Thus, the present inventors performed a simulation by using a computer to check the amount of positive ions (Ar+) entering into the gas holes during the etching process.

Figure 4:
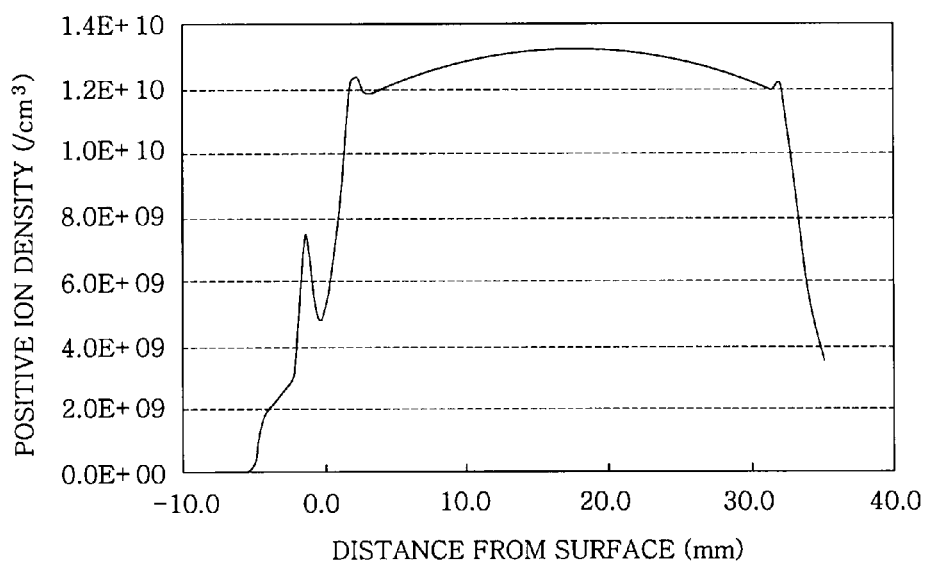
FIG. 4 is a graph showing results of simulations of positive ions which may enter into the gas holes of the shower plate during the etching process.

FIG. 4 is a graph showing simulation results of positive ions which may enter into the gas holes of the shower plate during the etching process. In the graph, the vertical axis represents positive ion density and the horizontal axis represents a distance from the bottom surface of the shower plate. In the horizontal axis, the depth of the gas holes has a negative value.

From the graph of FIG. 4, it can be seen that the density of positive ions from the bottom surface to a depth of 5 mm is zero or more, that is, the positive ions enter into the gas holes by a depth of 5 mm. Accordingly, when the gas holes are formed to have a depth larger than 5 mm, the positive ions are prevented from reaching the top surface after passing through the processing gas supply passageways, and it is possible to prevent abnormal discharge due to the positive ions.

The present invention is based on the above-described fact. In the embodiment of the present invention, the shower plate 31 has a following shape.

Figure 5A:
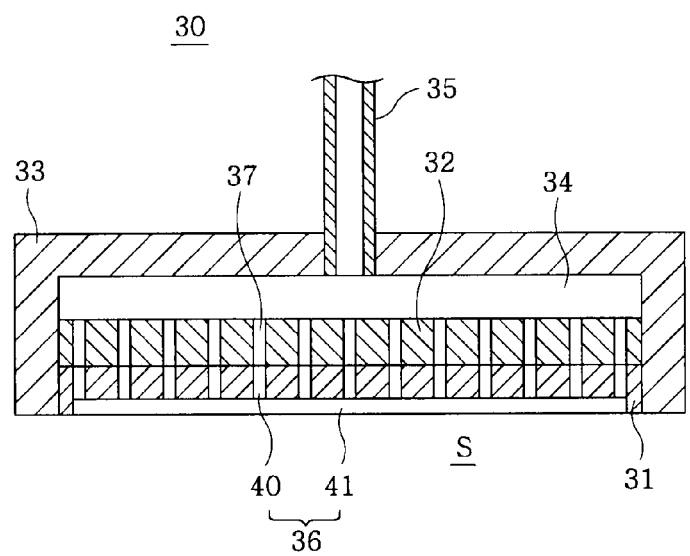
Figure 5B:
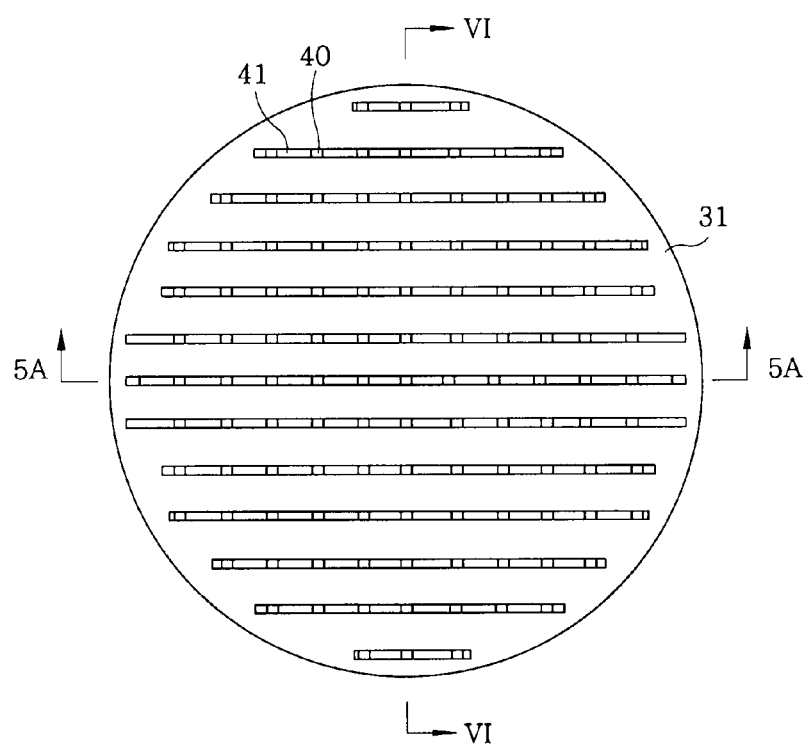
Figure 6:
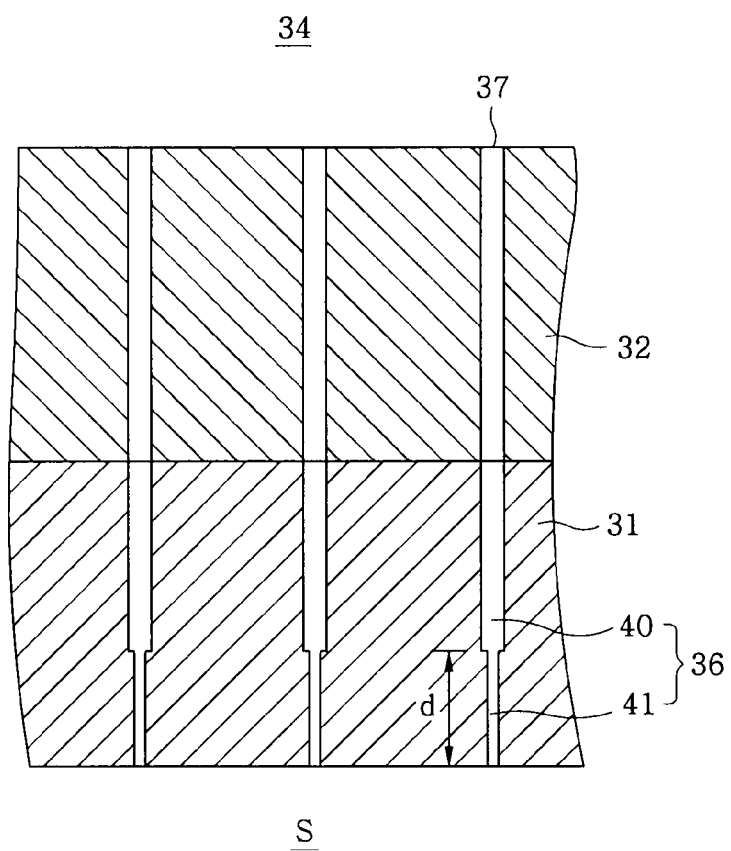
FIG. 6 illustrates a cross sectional view taken along a line VI-VI of FIG. 5B.

FIGS. 5A and 5B schematically show a configuration of a shower plate in accordance with the embodiment of the present invention. FIG. 5A illustrates an enlarged cross sectional view of a shower head having the shower plate. FIG. 5B illustrates a bottom view of the shower plate. Further, FIG. 5A illustrates a cross sectional view taken along a line 5A-5A of FIG. 5B. FIG. 6 illustrates a cross sectional view taken along a line VI-VI of FIG. 5B.

As shown in FIGS. 5A, 5B and 6, the processing gas supply passageways 36 passing through the shower plate 31 in a thickness direction include a plurality of gas holes 40 formed through the shower plate 31 in the thickness direction toward the space 34 and a plurality of slit-shaped gas grooves 41 formed in the thickness direction toward the processing space S. In this case, the gas grooves 41 have vertical sidewalls.

The gas grooves 41 are linearly formed parallel to each other when seen from a bottom view. A pitch of two neighboring grooves of the gas grooves 41 is set to be 5 mm or more, preferably, 10 mm~20 mm. A large pitch is preferable for the purpose of ensuring the strength of the shower plate 31.

The gas holes 40 communicate with the gas grooves 41 and the gas holes 40 are arranged corresponding to the gas grooves 41. Specifically, the gas holes 40 are uniformly arranged in a longitudinal direction of the gas grooves 41 to have openings at bottom portions of the corresponding gas grooves 41. The gas holes 40 have a same pitch regardless of the corresponding gas grooves 41. Respective diameters of the gas holes 40 range from 0.3 mm to 5 mm. It is preferable to form each of the gas holes 40 having a large diameter from a manufacturing viewpoint. Respective widths of the gas grooves 41 range from 0.01 mm to 0.5 mm. It is preferable to form each of the gas grooves 41 having a small width in order to prevent the electrons from entering into the gas grooves 41. It is necessary to form the gas grooves 41 to have a width equal to or smaller than 0.5 mm, which is the diameter of the gas holes 96 of the conventional shower plate 91. Further, a minimum value of the width of the gas grooves 41 is determined by a lower limit in the laser processing or cutter processing.

A depth d (see FIG. 6) of each of the gas grooves 41 is set to be larger than 5 mm, preferably, 8 mm. Accordingly, although positive ions enter into the processing gas supply passageways 36, the positive ions do not enter into the gas holes 40 and more surely do not reach the top surface after passing through the processing gas supply passageways 36.

Further, the total flow path cross sectional area of all the gas grooves 41 of the shower plate 31 is set to be larger than the total flow path cross sectional area of all the gas holes 40. Specifically, the total flow path cross sectional area of all the gas grooves 41 is set to be 1.75 or more times, preferably, 2.0 or more times, as large as the total flow path cross sectional area of all the gas holes 40. Accordingly, the pressure of the processing gas in the gas grooves 41 surely becomes lower than the pressure of the processing gas in the gas holes 40. Meanwhile, the total flow path cross sectional area of all the gas holes 40 of the shower head 30 is set to be almost the same as the total flow path cross sectional area of all gas holes (gas holes 96) of a conventional shower plate (shower plate 91). Accordingly, the total flow path cross sectional area of all the gas grooves 41 becomes 1.75 or more times as large as the total flow path cross sectional area of all gas holes of the conventional shower plate. Consequently, the pressure of the processing gas in the gas grooves 41 surely becomes lower than the pressure of the processing gas in the gas holes of the conventional shower plate.

In the shower plate 31 of the embodiment of the present invention, the space 34 and the processing space S communicate with each other. In the processing gas supply passageways 36 having a plurality of the gas holes 40 formed toward the space 34 and a plurality of the gas grooves 41 formed toward the processing space S, the total flow path cross sectional area of all the gas grooves 41 is larger than the total flow path cross sectional area of all the gas holes 40. When the processing gas is supplied to the processing space S from the space 34, the pressure of the processing gas in the processing gas supply passageways 36 increases along with the supply, and local discharge may occur from the processing gas in the processing gas supply passageways 36. However, since the total flow path cross sectional area of all the gas grooves 41 is 1.75 or more times as large as the total flow path cross sectional area of all the gas holes 40 (total flow path cross sectional of all gas holes of the conventional shower plate), the pressure of the processing gas in the gas grooves 41 does not increase during the supply of the processing gas in contrast to the case of the conventional shower plate. Accordingly, local discharge in the gas grooves 41 does not occur. As a result, it is possible to prevent the gas grooves 41 from being gradually eroded. Further, it is possible to surely prevent generation of abnormal discharge, thereby prolonging a lifetime of the shower plate 31.

In the above-described shower plate 31, in order to enlarge the flow path cross sectional area, the gas grooves 41 are formed instead of increasing the number of gas holes 40 or the diameter of the gas holes 40. Each of the gas grooves 41 can be easily formed to have a small width by laser processing or cutter processing. Accordingly, it is possible prevent electrons from entering into the gas grooves 41 from the processing space S while reducing the cost of the shower plate 31.

Further, as shown in FIG. 5B, the gas grooves 41 are formed on the shower plate 31 such that both ends of the gas grooves 41 do not reach an outer periphery of the shower plate 31 in a bottom view. Thus, it is possible to ensure the strength of the shower plate 31 and also easily prevent the shower plate 31 from being damaged.

In the above-described shower plate 31, each depth of the gas grooves 41 is larger than 5 mm. Accordingly, positive ions never reach the top surface after passing through the processing gas supply passageways 36. Thus, it is possible to prevent generation of abnormal discharge due to positive ions.

Further, the gas grooves 41 are linearly formed parallel to each other on the bottom surface of the shower plate 31. Accordingly, the gas grooves 41 can be easily formed, thereby preventing abnormal discharge while reducing the cost of the shower plate 31.

Further, the gas holes 40 are uniformly arranged in a longitudinal direction of the gas grooves 41 to have openings at bottom portions of the corresponding gas grooves 41. Accordingly, the processing gas in the gas grooves 41 can be substantially uniformly dispersed. Thus, it is possible to uniformly supply the processing gas into the processing space S through the shower plate 31. Further, since the processing gas can be uniformly supplied, the gas grooves 41 can be arranged relatively flexibly, thereby facilitating design of the shower plate 31.

Further, in the above-described shower head 30, the cooling plate 32 interposed between the space 34 and the shower plate 31 includes the gas holes 37 for allowing the space 34 to communicate with the processing gas supply passageways 36. Accordingly, the cooling plate 32 can cool the shower plate 31 without interfering with the supply of the processing gas.

Although the above-described shower plate 31 is formed of silicon, the shower plate 31 may be formed of quartz or aluminum without being limited to silicon. When the shower plate 31 is formed of aluminum, the surface of the shower plate 31 is coated with an insulating film by spraying.

Further, although the above-described shower plate 31 is formed of a single circular plate-shaped member, the shower plate 31 may be configured by stacking a plurality of circular plate-shaped members. For example, the shower plate may include an upper member (first member) disposed toward the space 34 and a lower member (second member) (both are not shown) disposed toward the processing space S by dividing the shower plate into two sections in a thickness direction, wherein the gas holes 40 are formed in the upper member and the gas grooves 41 are formed in the lower member. In this case, since the gas holes 40 and the gas grooves 41 can be formed through the upper member and the lower member, respectively, it is possible to more easily form the gas holes 40 and the gas grooves 41.

Figure 7A:
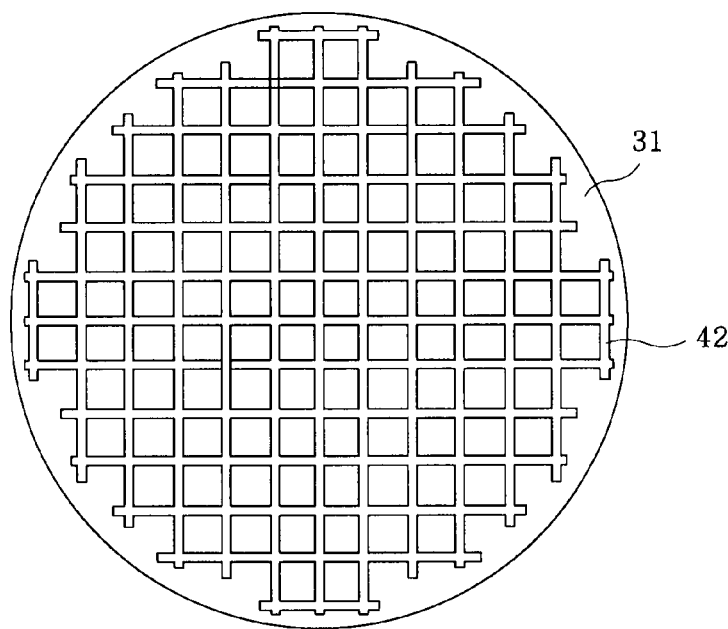
Figure 7B:
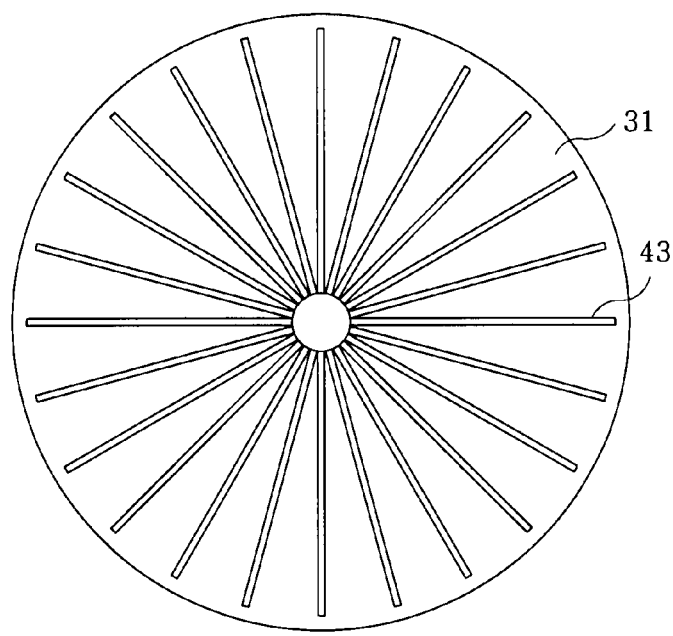

Although the gas grooves 41 are linearly formed parallel to each other on the bottom surface of the shower plate 31, the gas grooves may be formed as grid-shaped gas grooves 42 as shown in FIG. 7A, or radial gas grooves 43 as shown in FIG. 7B. In these cases, the processing gas can be more dispersedly supplied from the shower plate to the processing space S. Further, as described above, the gas grooves 41 may have a relatively flexible arrangement pattern on the bottom surface. In FIGS. 7A and 7B, the gas holes 40 of the shower plate 31 are not shown.

Figure 8A:
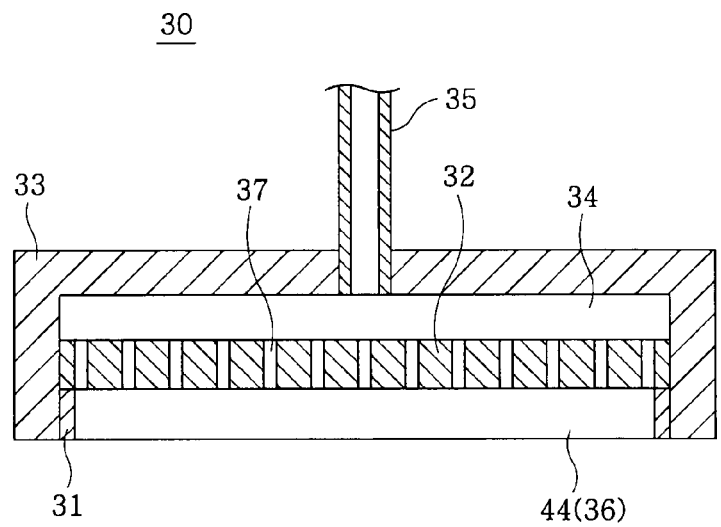
Figure 8B:
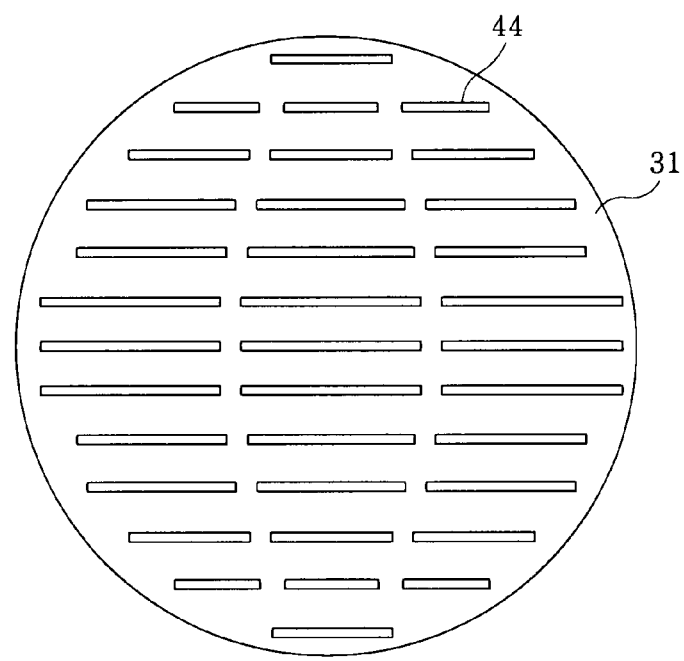

Further, although the processing gas supply passageways 36 include the gas holes 40 and the gas grooves 41 in the above-described shower plate 31, the processing gas supply passageways 36 may include only slit-shaped gas grooves 44 as shown in FIG. 8A. In this modified example, the gas holes 37 of the cooling plate 32 are uniformly arranged in a longitudinal direction of the gas grooves 44. Further, the gas grooves 44 are formed to have a length smaller than the gas grooves 41 of the shower plate 31 to ensure the strength of the shower plate 31 (see FIG. 8B). Further, the total flow path cross sectional area of all the gas grooves 44 of the shower plate 31 is set to be larger than the total flow path cross sectional area of all the gas holes 37 of the cooling plate 32. Further, the gas holes 37 of the cooling plate 32 are not shown.

In this modified example, when the processing gas is supplied to the processing space S through the space 34, the pressure of the processing gas in the gas grooves 44 increases along with the supply, and local discharge may occur from the processing gas in the gas grooves 44. However, since the total flow path cross sectional area of all the gas grooves 44 is larger than the total flow path cross sectional area of all the gas holes 37 (substantially the same as the total flow path cross sectional of all gas holes of the conventional shower plate as described above), the pressure of the processing gas in the gas grooves 44 does not increase during the supply of the processing gas in contrast to the case of the conventional shower plate. Accordingly, local discharge in the gas grooves 44 does not occur.

Figure 9A:
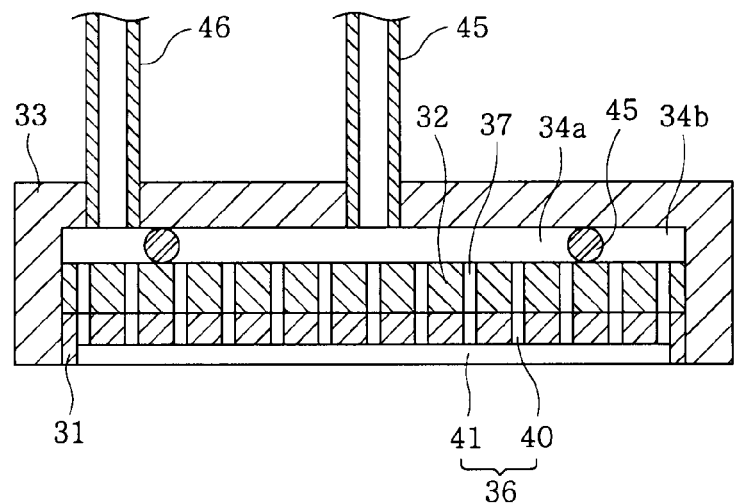
Figure 9B:
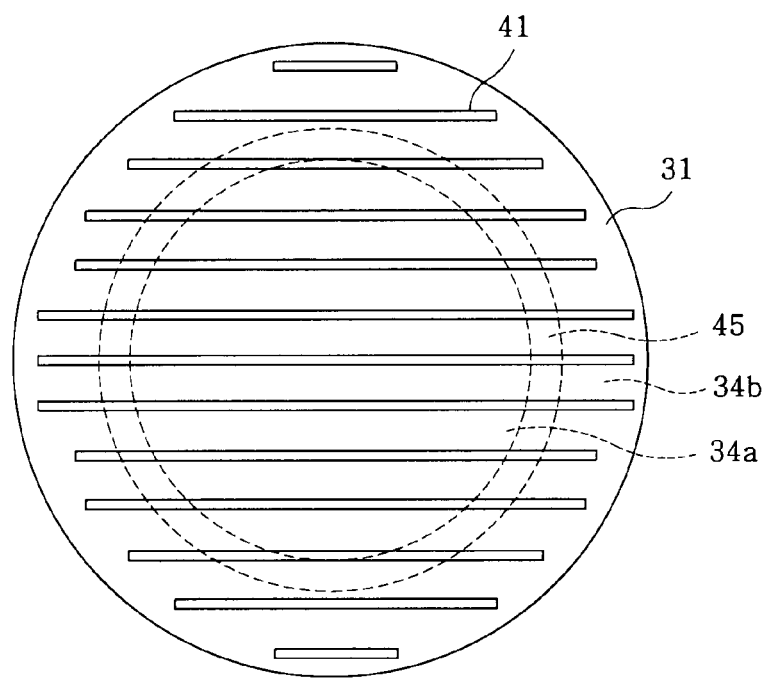
Figure 10A:
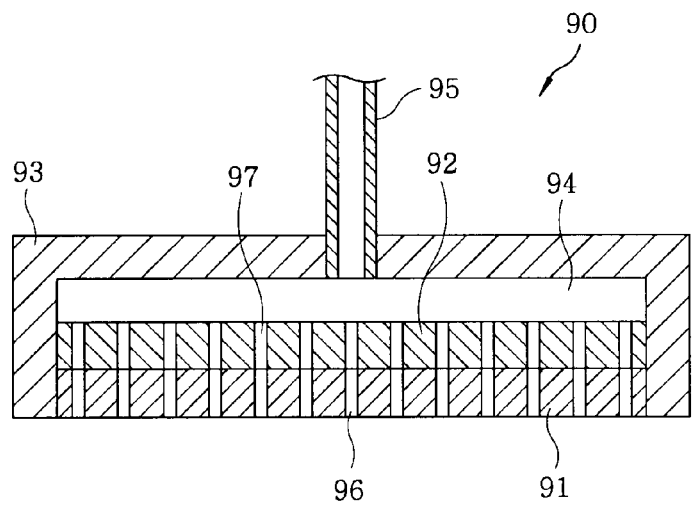
Figure 10B:
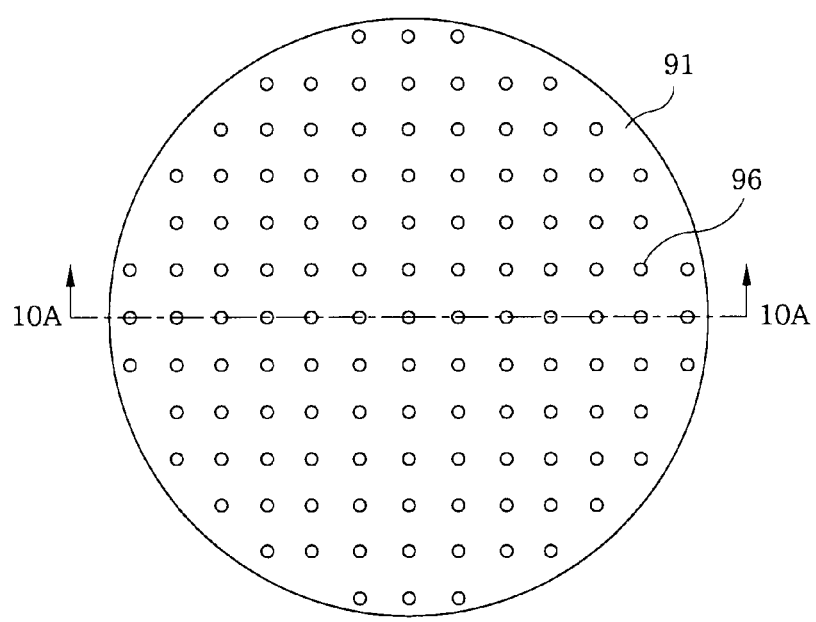

Further, when the shower head 30 supplies two kinds of processing gases into the processing space S at the same time, the space 34 is divided into a central portion 34a and an edge portion 34b by an O ring 45, and the processing gas is introduced to the edge portion 34b by another processing gas inlet pipe 46 (see FIG. 9A). However, the gas grooves 41 are not divided correspondingly to the central portion 34a and the edge portion 34b (see FIG. 9B). Accordingly, before two kinds of processing gases are supplied into the processing space processing space S, the two kinds of processing gases can be mixed in the gas grooves 41, thereby preventing non-uniformity of various gases in the processing space S. Further, the gas holes 40 of the shower plate 31 are not shown in FIG. 9B.

Although the above-described shower plate 31 is applied to the substrate processing apparatus 10 which performs an etching process on a semiconductor wafer, a shower plate having the same configuration as the shower plate 31 may be also applied to a substrate processing apparatus which performs a plasma process on a glass substrate such as liquid crystal display (LCD) or flat panel display (FPD).

Further, although two types of high frequency power are supplied to the susceptor 12 in the above-described substrate processing apparatus 10, one type of high frequency power may be supplied to each of the susceptor 12 and the shower head 30. In this case, an electrode plate is disposed between the shower plate 31 and the cooling plate 32, and a high frequency power supply is connected to the electrode plate. Further, a plurality of gas holes for allowing the gas holes 40 to communicate with the gas grooves 41 are formed on the electrode plate. The total flow path cross sectional area of all gas holes of the electrode plate is set to be larger than the total flow path cross sectional area of all the gas holes 37 of the cooling plate 32 so as not to interfere with the flow of the processing gas.

While the invention has been shown and described with respect to the embodiments, it will be understood by those skilled in the art that various changes and modifications may be made without departing from the scope of the invention as defined in the following claims.

What is claimed is:

1. A shower plate of a processing gas supply unit disposed in a processing chamber of a substrate processing apparatus to supply a processing gas into a processing space in the processing chamber, which is interposed between a processing gas introduction space formed in the processing gas supply unit for introduction of the processing gas and the processing space, the shower plate comprising:
   processing gas supply passageways which allow the processing gas introduction space to communicate with the processing space;
   a first member disposed toward the processing gas introduction space; and
   a second member disposed toward the processing space, wherein the processing gas supply passageways include gas holes formed toward the processing gas introduction space and gas grooves formed toward the processing space, the gas holes and the gas grooves communicating with each other, wherein the first member and second member divide the shower plate into two sections in a vertical direction, wherein the gas holes are formed in the first member and not in the second member, wherein the gas grooves are formed in the second member and not in the first member, wherein the first member is stacked on the second member to form a single plate-shaped member in which the gas holes are aligned with the gas grooves, wherein a total flow path cross sectional area of all the gas grooves, which is perpendicular to a flow path of the processing gas, is larger than a total flow path cross sectional area of all the gas holes, which is perpendicular to the flow path of the processing gas, and wherein widths of the gas grooves are smaller than diameters of the gas holes.

2. The shower plate of claim 1, wherein the total flow path cross sectional area of all the gas grooves is equal to or greater than 1.75 times the total flow path cross sectional area of all the gas holes.

3. The shower plate of claim 2, wherein a depth of each of the gas grooves is larger than 5 mm.

4. The shower plate of claim 3, wherein the depth of each of the gas grooves extends from an opening of each of the gas grooves in communication with the processing space to an opening of each the gas grooves in communication with the gas holes, and wherein each of the gas holes overlaps the opening of each of the gas grooves in communication with each of the gas holes.

5. The shower plate of claim 1, wherein a depth of each of the gas grooves is larger than 5 mm.

6. The shower plate of claim 1, wherein the gas grooves are linearly formed parallel to each other on a surface facing the processing space.

7. The shower plate of claim 1, wherein the gas holes are uniformly arranged in a longitudinal direction of the corresponding gas grooves to have openings at bottom portions of the gas grooves.

8. The shower plate of claim 1, wherein the widths of the gas grooves range from 0.01 mm to 0.5 mm.

9. A substrate processing apparatus comprising:

a processing chamber for accommodating a substrate and performing a process on the substrate; and a processing gas supply unit disposed in the processing chamber to supply a processing gas into a processing space in the processing chamber, wherein the processing gas supply unit includes a shower plate interposed between a processing gas introduction space formed in the processing gas supply unit for introduction of the processing gas and the processing space, the shower plate having processing gas supply passageways which allow the processing gas introduction space to communicate with the processing space, wherein the processing gas supply passageways include gas holes formed toward the processing gas introduction space and gas grooves formed toward the processing space, the gas holes and the gas grooves communicating with each other, wherein the shower plate includes a first member disposed toward the processing gas introduction space, and a second member disposed toward the processing space, wherein the first member and the second member divide the shower plate in a vertical direction, wherein the gas holes are formed in the first member and not in the second member, wherein the gas grooves are formed in the second member and not in the first member, wherein the first member is stacked on the second member to form a single plate-shaped member in which the gas holes are aligned with the gas grooves, wherein a total flow path cross sectional area of all the gas grooves, which is perpendicular to a flow path of the processing gas, is larger than a total flow path cross sectional area of all the gas holes, which is perpendicular to the flow path of the processing gas, and wherein widths of the gas grooves are smaller than diameters of the gas holes.

10. The substrate processing apparatus of claim 9, wherein the processing gas supply unit further includes a cooling plate interposed between the processing gas introduction space and the shower plate to cool the shower plate, and wherein the cooling plate has through holes allowing the processing gas introduction space to communicate with the processing gas supply passageways.

11. The substrate processing apparatus of claim 9, wherein the shower plate supplies a first and a second gas into the processing space at the same time, the processing gas introduction space is divided into a central portion and an peripheral portion by an O ring, and the first and the second processing gas are introduced to the shower plate via the central and the peripheral portion, respectively.

12. The substrate processing apparatus of claim 9, wherein the widths of the gas grooves range from 0.01 mm to 0.5 mm.

13. The substrate processing apparatus of claim 9, wherein the total flow path cross sectional area of all the gas grooves is equal to or greater than 1.75 times the total flow path cross sectional area of all the gas holes, and wherein a depth of each of the gas grooves is larger than 5 mm.

14. The substrate processing apparatus of claim 9, wherein the depth of each of the gas grooves extends from an opening of each of the gas grooves in communication with the processing space to an opening of each the gas grooves in communication with the gas holes, and wherein each of the gas holes overlaps the opening of each of the gas grooves in communication with each of the gas holes.

* * * * *